United States Patent
Odnoblyudov et al.

(10) Patent No.: US 8,053,755 B2
(45) Date of Patent: Nov. 8, 2011

(54) SEMICONDUCTOR HETEROSTRUCTURE

(75) Inventors: Maxim A. Odnoblyudov, Espoo (FI); Vladislav E. Bougrov, Espoo (FI)

(73) Assignee: OptoGaN Oy, Espoo (FI)

( * ) Notice: Subject to any disclaimer, the term of this patent is extended or adjusted under 35 U.S.C. 154(b) by 682 days.

(21) Appl. No.: 11/663,142

(22) PCT Filed: Sep. 19, 2005

(86) PCT No.: PCT/FI2005/000394
§ 371 (c)(1), (2), (4) Date: Aug. 7, 2008

(87) PCT Pub. No.: WO2006/030064
PCT Pub. Date: Mar. 23, 2006

(65) Prior Publication Data
US 2008/0283818 A1    Nov. 20, 2008

(30) Foreign Application Priority Data
Sep. 17, 2004 (FI) .................................. 20041213

(51) Int. Cl.
*H01L 29/06* (2006.01)
*H01L 31/072* (2006.01)
*H01L 31/0336* (2006.01)
*H01L 31/0328* (2006.01)
*H01L 31/109* (2006.01)

(52) U.S. Cl. ................ 257/13; 257/14; 257/94; 257/96; 257/103; 257/E33.027

(58) Field of Classification Search .................. None
See application file for complete search history.

(56) References Cited

U.S. PATENT DOCUMENTS

| 4,122,407 A | * | 10/1978 | Van Vechten | 372/45.012 |
| 5,224,114 A |  | 6/1993 | Ikeda et al. |  |
| 5,610,413 A | * | 3/1997 | Fan et al. | 257/97 |
| 5,877,509 A |  | 3/1999 | Pau et al. |  |

(Continued)

FOREIGN PATENT DOCUMENTS
GB    2 352 326    1/2001
(Continued)

OTHER PUBLICATIONS

European Search Report from Application No. EP 07 07 5739.
(Continued)

*Primary Examiner* — Zandra Smith
*Assistant Examiner* — Khanh B Duong
(74) *Attorney, Agent, or Firm* — Fay Sharpe LLP

(57) ABSTRACT

A strained semiconductor heterostructure (10) comprises an injection region comprising a first emitter layer (11) having p-type conductivity and a second emitter layer (12) having n-type conductivity, and a light generation layer (13) positioned between the first emitter layer (11) and the second emitter layer (12). An electron capture region (14) is positioned between the light generation layer (13) and the second emitter layer (12), said electron capture region comprising a capture layer (16) adjacent to the second emitter layer, and a confining layer (15) adjacent to said electron capture layer. According to the present invention, the widths and materials of the confining and capture layers (15, 16) are selected to provide energy difference between one of localized energy levels for electrons in the capture layer (16) and the conduction band bottom of the second emitter layer (12) equal to the energy of the optical phonon.

24 Claims, 6 Drawing Sheets

U.S. PATENT DOCUMENTS

| | | | |
|---|---|---|---|
| 5,959,307 | A | 9/1999 | Nakamura et al. |
| 6,515,313 | B1 | 2/2003 | Ibbetson et al. |
| 6,534,797 | B1 * | 3/2003 | Edmond et al. ............... 257/97 |
| 6,569,704 | B1 | 5/2003 | Takeuchi et al. |
| 6,614,060 | B1 | 9/2003 | Wang et al. |
| 6,677,619 | B1 | 1/2004 | Nagahama et al. |
| 6,764,888 | B2 | 7/2004 | Khan et al. |
| 6,859,477 | B2 * | 2/2005 | Deppe et al. ............ 372/45.01 |
| 6,878,970 | B2 | 4/2005 | Bour et al. |
| 6,943,381 | B2 | 9/2005 | Gardner et al. |
| 6,955,933 | B2 | 10/2005 | Bour et al. |
| 6,982,438 | B2 | 1/2006 | Ishizaki |
| 6,987,286 | B2 * | 1/2006 | McGill et al. ............... 257/97 |
| 6,995,389 | B2 | 2/2006 | Kim et al. |
| 7,224,041 | B1 * | 5/2007 | Sherohman et al. ......... 257/613 |
| 2004/0101012 | A1 | 5/2004 | Nakamura et al. |
| 2004/0235212 | A1 | 11/2004 | Ishizaki |
| 2005/0127391 | A1 | 6/2005 | Yanamoto |

FOREIGN PATENT DOCUMENTS

| | | |
|---|---|---|
| JP | 2211686 | 8/1990 |
| JP | 6334168 | 12/1994 |
| JP | 10022524 | 1/1998 |
| JP | 11068256 | 3/1999 |
| JP | 11261170 | 9/1999 |
| JP | 2000357819 | 12/2000 |
| JP | 2001102690 | 4/2001 |
| WO | WO 01/41224 | 6/2001 |
| WO | WO 01/54206 | 7/2001 |
| WO | WO 03/030273 | 4/2003 |
| WO | WO 03/063215 | 7/2003 |

OTHER PUBLICATIONS

Eurpean Search Report from Application No. EP 05 78 9107, Apr. 28, 2011.

Cao, S. M. et al. "Bistable electroluminescence in p-i-n. light-emitting tunnel-diodes enhanced by aperiodic-superlattice injectors", Applied Physics Letter, AIP, American Institute of Physics, Melville, NY, vol. 72., No. 3, Jan. 19, 1998, pp. 347-349 XP012020570.

Faist J. et al. "Quantum Cascade Laser" Science, American Association for the Advancement of Science, Washington, DC. vol. 264, No. 5158, Apr. 22, 1994, pp. 553- 556, XP000541768.

European Search Report from Application No. EP 05 78 9107.

* cited by examiner (a)

(b)

(c)

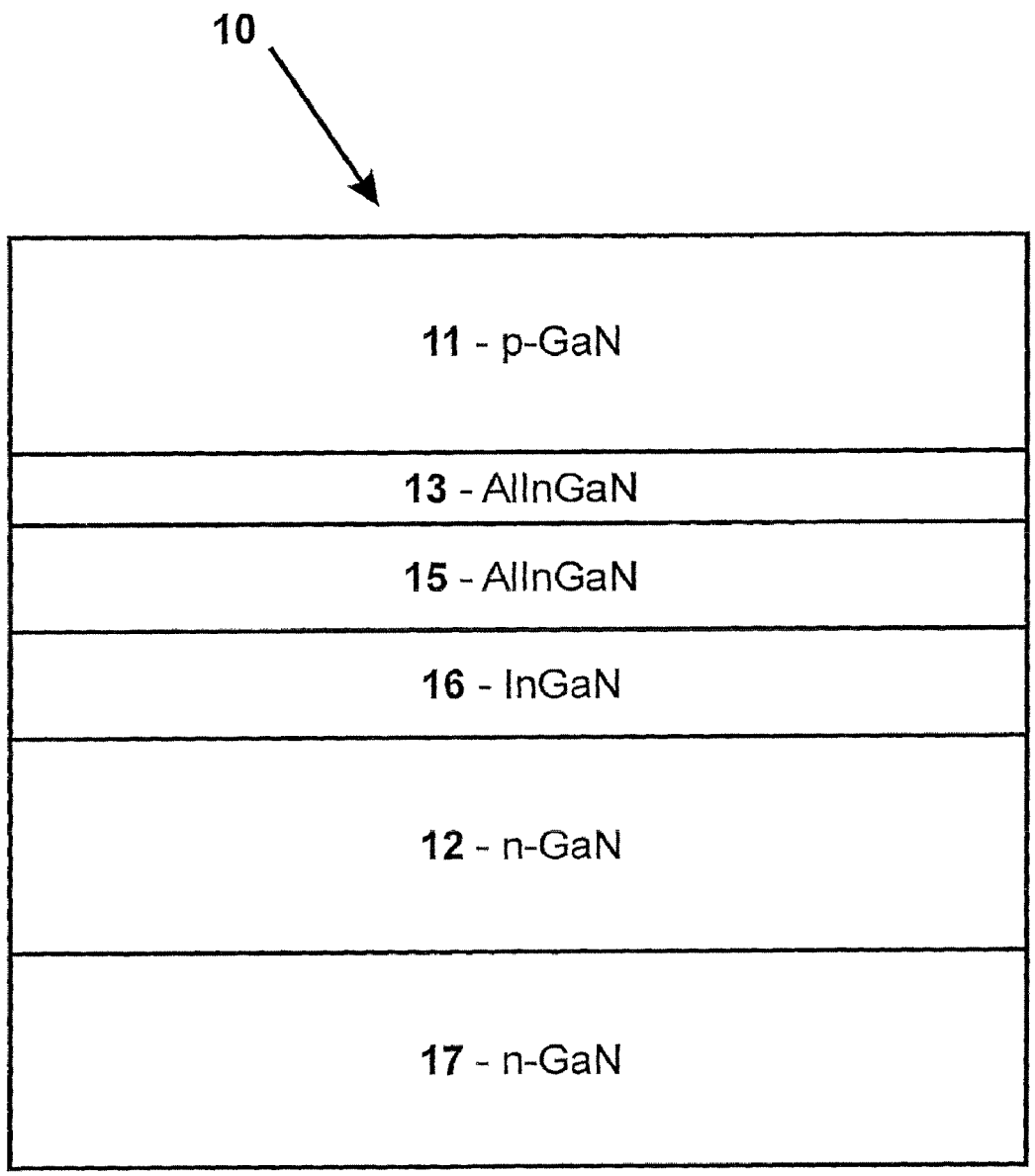

SEMICONDUCTOR HETEROSTRUCTURE

FIELD OF THE INVENTION

The present invention relates to a semiconductor heterostructure for light emitting devices, particularly a structure formed of lattice mismatched semiconductor materials. The heterostructure comprises an injection region consisting of two emitters, a light generation layer, and an electron capture region. In particular, the heterostructure can be made of pyroelectric materials, particularly nitrides of group III metals and their alloys. The heterostructure can also be made of nitrogen containing arsenides and phosphides of group III metals.

BACKGROUND OF THE INVENTION

The external quantum efficiency of a light emitting diode, herein referred to as LED, can be defined as:

$$\eta_{ext} = \gamma \cdot \eta_{cap} \cdot \eta_{int} \cdot \eta_{out},$$

where $\gamma$ is the injection efficiency, $\eta_{cap}$ is the efficiency of carrier capture into light generation region, $\eta_{int}$ is the radiative efficiency provided by radiative recombination of carriers inside the light generation region, $\eta_{out}$ is the light extraction efficiency. Maximum LED efficiency is obtained by maximizing all these parameters. The first three factors are overlapping and it is optimal to address them simultaneously during design of a LED structure.

The first factor to address is the efficiency of carrier capture into light generation region. In case of lattice mismatch between the device layers, thickness of the layer where electrons and holes recombine should be small enough to preserve material quality and avoid strain relaxation via nucleation of dislocations. However carrier capture into the light generation layer is significantly reduced when decreasing the layer thickness. The capture can be characterized by the relation $$q_+ - q_- = -n\frac{d}{\tau},$$

where $q_+$ and $q_-$ are the carrier fluxes, incident to the light generation layer and transmitted over it, n is the carrier concentration in an emitter, d is the width of the light generation narrow bandgap layer, and $\tau$ is the capture time, usually determined by electron-optical phonon interaction. The relation shows that captured part of the carrier flux is decreased with decreasing the width of the light generation layer and is reverse proportional to the capture time. For fixed width of the light generation layer, capture of carriers is less effective for electrons than for holes due to lower value of electron effective mass and, consequently, longer energy relaxation time $\tau$. Another inherent mechanism, which reduces carrier capture into the narrow bandgap region, is partial reflection of the electron or hole wave from that region. Therefore, the probability for carrier to be inside the narrow bandgap region decreases, which results in less effective coupling with localized state inside narrow bandgap layer and in increasing of the capture time $\tau$. In result, the capture efficiency of the device drops and maximum of the efficiency $\eta_{ext}$ vs. injection current is located far below the typical device operating current. A number of structures were proposed to solve this problem. One of the solutions is to use an additional wide bandgap layer on the hole injecting side of the light generation region to prevent electron overflow over this region. This solution was adapted to the case of nitride-based light emitting devices by Nagahama et al in U.S. Pat. No. 6,677,619 and references therein. However, presence of such barrier increases electron and hole reflection, making this solution not optimal. To prevent carriers escape from the light generation region, Nakamura et al in US patent application No 2004/0101012 suggested to insert two barriers from both sides of the light generation region. Due to in general this solution leads to high reflection of carriers from barriers, the authors suggested to make the barriers as thin as possible to increase probability of carrier tunneling through them. One disadvantage of this solution, however, is that the tunneling of carriers in this case is not resonant, and therefore for any reasonable barrier thickness the reflection of carriers from the barriers significantly decreases efficiency of carrier capture into the light generation region. Wang et al in GB patent No 2,352,326 disclose the CART structure, where electrons are collected in a preliminary reservoir in n-type part of structure, from which they resonantly tunnel to the light generation region. The reservoir should be thick enough to effectively collect carriers. In fact, it is hard to realize thick high quality layer on the basis of lattice mismatched semiconductor materials.

The second factor to address is the injection efficiency. Since light is generated inside a thin light generation layer, which is placed near the p-n interface, it is desirable to provide maximum injection efficiency at this interface. Ordinary solution is to dope emitters as large as possible without deterioration of material quality. However, for the materials where the concentration of active doping centers in one of the emitters is limited by fundamental material properties, excessive doping of the other emitter breaks the balance of electron and hole injection currents at the light generation layer resulting in reduced injection efficiency.

The third factor to address is the radiative efficiency. If a device is made from pyroelectric materials, spontaneous polarization and piezo polarization induced by strain exist in the structure, giving rise to built-in electric field, which spatially separates electrons and holes inside the light generation region. In result, non-direct optical transitions are required for radiative recombination. Such non-direct recombination leads to a decrease of device radiative quantum efficiency. The phenomenon is discussed in a number of publications, including Bernardini et al, "Spontaneous polarization and piezoelectric constants of III-V nitrides", American Physical Society Journal, Physics Review B, Vol. 56, No. 16, 1997, pages R10024-R10027; Takeuchi et al, "Quantum-Confined Stark Effect due to Piezoelectric Fields in GaInN Strained Quantum Wells", Japanese Journal of Applied Physics, Vol. 36, Part 2, No. 4, 1997, pages L382-L385; and Ambacher et al, "Pyroelectric properties of Al(In)GaN/GaN hetero- and quantum well structures", Journal of Physics: Condensed Matter, Vol. 14, 2002, pages 3399-3434. To some extent the effect of built-in polarization can be minimized by use of very thin light generation layers. However, such small thickness, as we mentioned above, results in non-effective carrier capture. Besides, width of the light generation layers might become comparable with thickness fluctuations. These fluctuations can lead to formation of "holes" in the light generation layers, which act as non-radiative recombination centers, thus additionally reducing device efficiency. As a conclusion, the polarization induced built-in electric field limits both radiative efficiency and capture rate. Ibbetson et al in U.S. Pat. No. 6,515,313 disclose several techniques to diminish the effect of polarization induced charges: selective doping to provide an impurity charge, which might compensate polarization induced charge; cladding layers with graded composition; active region with graded or mixed composition; inverted polarization. Another solution is to use lattice matched semiconductor compounds as materials for the light generation region. However, in pyroelectric materials spontaneous polarization also exists, which is non-zero even in relaxed or lattice-matched layers. For example, the value of spontaneous polarization in nitrides of group III metals is similar to that arising from piezoelectric effect. Several other techniques to reduce piezoelectric polarization are disclosed by Takeuchi et al in U.S. Pat. No. 6,569,704 and by Goetz et al in U.S. Pat. No. 6,630,692.

As it is followed from the above discussion, development of a highly efficient light emitting structure will be more effective in case of consistent solutions of preferably all of the above-mentioned problems.

PURPOSE OF THE INVENTION

The objective of the invention is to eliminate the disadvantages referred to above.

One specific objective of the invention is to disclose a new type of strained semiconductor heterostructure with enhanced total light generating capability, the heterostructure being formed e.g. from pyroelectric semiconductor materials as nitrides of group III metals and their alloys, or from nitrogen containing arsenides and phosphides of group III metals.

An objective of the invention is also to disclose a new type of light emitting diode utilizing said strained semiconductor heterostructure.

SUMMARY OF THE INVENTION

The strained semiconductor heterostructure in accordance with the present invention is characterized by what is presented in claim 1.

The semiconductor heterostructure of the present invention includes: an injection region comprising a first emitter layer of p-type conductivity and a second emitter layer of n-type conductivity, a light generation layer that is positioned between the emitter layers, and an electron capture region that is inserted between the second emitter layer and the light generation layer. The electron capture region comprises a capture layer adjacent to the second emitter layer and a confining layer adjacent to the capture layer. As used herein, the term "strained heterostructure" generally refers to a heterostructure consisting of individual layers, where in-plane lattice parameter of at least one layer differs from its equilibrium value, and the term "layer" generally refers to a single crystal epitaxial layer. The purpose of the electron capture region is to provide relaxation of the electron energy and decrease electron overflow over the light generation layer. The bandgap energy of the light generation layer is smaller than those of the emitter layers and the confining layer. The capture layer has a bandgap energy smaller than that of the confining layer. In addition, the energy position of the lowest energy level for electrons in the capture layer is higher than that in the light generation layer.

According to the present invention, the widths and materials of the capture layer and the confining layer are selected to provide energy difference between one of localized energy levels for electrons in the capture layer and the conduction band bottom of the second emitter layer equal to the energy of the optical phonon. The term "optical phonon energy" generally refers to energy of optical type of lattice vibration in the vicinity of zero wave vector value. The capture of electrons into the narrow bandgap capture layer due to interaction with longitudinal optical (LO) phonons will be enhanced in comparison with the capture to an arbitrary positioned level, because in the aforementioned situation momentum transferred to the phonon during electron downward transition will be almost zero. The relaxation occurs mainly due to spontaneous emission of optical phonon at moderate temperatures. The reverse carrier thermal emission from the narrow bandgap capture layer to the emitter layer occurs due to absorption of phonons and therefore will be suppressed by factor $N_q/(1+N_q)$, where $N_q$ is the number of phonons given by the Planck distribution. For example, in case of nitrides of group III metals, the optical phonon energy is about 100 meV; therefore the emission rate will be suppressed in comparison with the capture rate by about 40 times at room temperature. Further relaxation of the carrier energy occurs either via lower energy levels within the capture layer and then to the adjacent narrow bandgap light generation layer or directly to the light generation layer. Thus, the capture layer in accordance with the present invention has highly enhanced electron capture efficiency in comparison with the prior art structures.

According to one preferred embodiment of the present invention, the concentration of electrons in the second emitter layer is adjusted to equal to the product of: (1) concentration of holes in the first emitter layer, (2) the ratio of the diffusion coefficient for holes in the second emitter layer and the diffusion coefficient for electrons in the first emitter layer, and (3) the ratio of the diffusion length for electrons in the first emitter layer and the diffusion length for holes in the second emitter layer. With this condition fulfilled, the concentrations of holes and electrons in the injection region are matched and provide balance of infection currents in the light generation layer resulting in maximal injection efficiency. The theory behind this electron concentration adjustment is shortly explained in the following.

Since light is generated inside a thin light generation layer, which is placed near the p-n interface, it is desirable to provide maximum injection efficiency at this interface. In frame of the Shockley-Noyce-Sah model, which assumes recombination inside space charge region and corresponds to typical LED operating currents, the recombination rate is proportional to the product of electron and hole injection current densities, but not to the product of majority carrier concentrations in emitters. For those skilled in the art, it is clear that the reason is that in a p-n junction under forward bias, concentrations of injected carriers depend on minority carrier concentrations and applied voltage but not on majority carrier concentrations. Thus, the injection efficiency is maximal provided the electron and hole current densities are equal at the p-n interface, due to the total current density is equal to the sum of these two current densities and is constant across the structure. For a given p-emitter hole concentration $p_p$, the equality of the electron and hole current densities sets a condition for the n-emitter electron concentration $n_n$ as:

$$n_n \approx \frac{D_p L_n}{D_n L_p} \cdot p_p,$$

where $D_p$ and $D_n$ are diffusion coefficients, and $L_p$ and $L_n$ are diffusion lengths for minority carriers in n- and p-emitters, correspondingly. As used herein, the definitions of the terms "diffusion coefficient" and "diffusion length" can be found, for example, in the book of N. W. Ashcroft and N. D. Mermin "Solid State Physics", Saunders College Publishing, 1976, pages 602-604. The process of providing required electron and hole concentrations in layer is well known for those skilled in the art. For the assumed group of semiconductor materials (for example, in nitrides of group III metals) it is typical that electron concentration in n-emitter is several times higher than hole concentration in p-emitter. In this case, electron injection current inside the space charge region is higher than hole injection current resulting in injection efficiency drop as compared to maximal possible efficiency. The most obvious solution to enhance light generating capability in this case is to increase hole concentration in the p-emitter. However, p-type doping can be limited by fundamental properties of the material. In the heterostructure of the current embodiment of the present invention, balance between electron and hole injection currents is provided by proper n-emitter design in the p-n junction. In this case, a middle-doped n-emitter is placed between n-contact layer and the electron capture region.

In one embodiment of the present invention the strained semiconductor heterostructure is made of pyroelectric semiconductor materials, and the light generation layer has a composition and thickness, at which electrical field induced by spontaneous pyroelectric polarization has a magnitude substantially equal and direction substantially opposite to the corresponding ones of the strain-induced piezoelectric field. As used herein, the definitions of the terms "pyroelectric polarization" and "piezoelectric polarization" can be found, for example, in the book of N. W. Ashcroft and N. D. Mermin "Solid State Physics", Saunders College Publishing, 1976, page 555. The idea is to provide a fixed lattice mismatch between the emitter layers and the light generation layer, so that the electric field $E_{piezo}$ induced by superposition of piezoelectric polarization charges will compensate the field $E_{sp}$ induced by superposition of spontaneous polarization charges:

$E_{sp} \approx E_{piezo}$

In this case, carriers are not spatially separated inside the light generation layer, and it results in enhanced radiative efficiency. For example, in AlInGaN layer piezoelectric and spontaneous polarizations might be directed in opposite directions depending on composition. Therefore material of the light generation layer and neighboring layers are selected to provide magnitude of built-in field induced by spontaneous (pyroelectric) polarization equal to magnitude of built-in piezoelectric field and direction of built-in field induced by spontaneous (pyroelectric) polarization opposite to direction of built-in piezoelectric field. Pyroelectric layer materials can be for example nitrides of group III metals and their alloys. At least one of the emitter layers can include $Al_xGa_{1-x}N$, in which $0 \leq x \leq 1$. At least one of the light generation layer, confining layer, and capture layer can include $Al_xIn_yGa_{1-x-y}N$, in which $0 \leq x \leq 1$, $0 \leq y \leq 1$, $0 \leq x+y \leq 1$.

Preferable non-pyroelectric materials for the structure of the present invention are nitrogen containing arsenides and phosphides of group III metals. For example, at least one of the emitter layers, light generation layer, confining layer and capture layer can include $Al_xIn_yGa_{1-x-y}As_aN_bP_{1-a-b}$, in which $0 \leq x \leq 1$, $0 \leq y \leq 1$, $0 \leq x+y \leq 1$ and $0 \leq a \leq 1$, $0 \leq b \leq 0.1$, $0 \leq a+b \leq 1$.

As one preferred embodiment of the present invention, further enhanced carrier relaxation, if desired, can be provided by insertion of additional layers into the structure. According to this embodiment, at least one pair of wide and narrow bandgap layers is inserted between the confining layer and the light generation layer, the layer adjacent to the confining layer being a narrow bandgap layer. Bandgap energies of the wide bandgap layers are larger than those of the narrow bandgap layers and that of the light generation layer. Compositions and widths of the narrow and wide bandgap layers are chosen to provide the lowest energy levels for electrons in any narrow bandgap layer higher that in the light generation layer, lower than that of the capture layer, and lower than those in the narrow bandgap layers located between the considered narrow bandgap layer and the confining layer. In addition, said compositions and widths are selected to provide energy difference between the lowest localized energy level for electrons in the capture layer (16) and that in the narrow bandgap layer adjacent to the confining layer equal to the energy of the optical phonon. Such adjustment to the phonon energy can be provided also between every pair of neighboring narrow bandgap layers. The downward energy relaxation in this kind of structure occurs via sequence of phonon assisted relaxation processes, and, therefore, will be further enhanced.

Also the structure containing said additional wide and narrow bandgap layers can be made of pyroelectric materials. In this case, at least one of the emitter layers can include $Al_xGa_{1-x}N$, in which $0 \leq x \leq 1$. At least one of the light generation layer, confining layer, and capture layer can include $Al_xIn_yGa_{1-x-y}N$, in which $0 \leq x \leq 1$, $0 \leq y \leq 1$, $0 \leq x+y \leq 1$. The additional layers can comprise for example alternating $Al_{mi}In_{ni}Ga_{1-mi-ni}N$ wide bandgap and $Al_{ki}In_{li}Ga_{1-ki-li}N$ narrow bandgap layers, in which i numerates pairs, $0 \leq mi \leq 1$, $0 \leq ni \leq 1$, $0 \leq mi+ni \leq 1$, $0 \leq ki \leq 1$, $0 \leq li \leq 1$, $0 \leq ki+li \leq 1$.

In structures according to the present invention having pyroelectric layer materials described above, an additional low resistivity region of n-type conductivity can be added adjacent to said second emitter layer, the low resistivity region comprising lateral current spreading superlattice formed of plurality of pairs of alternating $Al_xGa_{1-x}N$ and $Al_yGa_{1-y}N$ layers, in which $0 \leq x \leq 1$ and $0 \leq y \leq 1$.

In a non-pyroelectric structure with additional wide and narrow bandgap layers in the capture region, at least one of the emitter layers, light generation layer, confining layer and capture layer can include $Al_xIn_yGa_{1-x-y}As_aN_bP_{1-a-b}$, in which $0 \leq x \leq 1$, $0 \leq y \leq 1$, $0 \leq x+y \leq 1$ and $0 \leq a \leq 1$, $0 \leq b \leq 0.1$, $0 \leq a+b \leq 1$. The additional layers can comprise for example alternating $Al_{mi}In_{ni}Ga_{1-mi-ni}As_{pi}N_{qi}P_{1-pi-qi}$ wide bandgap and $Al_{ki}In_{li}Ga_{1-ki-li}As_{ri}N_{si}P_{1-ri-si}$ narrow bandgap layers, in which i numerates pairs, $0 \leq mi \leq 1$, $0 \leq ni \leq 1$, $0 \leq mi+ni \leq 1$, and $0 \leq pi \leq 1$, $0 < qi \leq 0.1$, $0 \leq pi+qi \leq 1$, and $0 \leq ki \leq 1$, $0 \leq li \leq 1$, $0 \leq ki+li \leq 1$, and $0 \leq ri \leq 1$, $0 < si \leq 0.1$, $0 \leq ri+si \leq 1$.

The light emitting diode (LED) in accordance of the present invention is characterized by what is presented in claim 11. The light emitting diode comprises the strained semiconductor heterostructure described above. Thus it has greatly enhanced light emitting efficiency in comparison to the prior art devices. The entire device is designed for enhanced light generating capability during high current density operation. All the described aspects of the preferred embodiments of the invention, i.e. the phonon energy adjustment, additional capture region layers, electron concentration adjustment and the piezoelectric field compensation, may overlap, and it is advantageous to address them simultaneously to achieve optimal device performance. For example, compositions of the light generation layer, the narrow bandgap layer in the electron capture region and the emitter layers may be chosen to provide (a) flat zone profile in the light generation layer, (b) transition energy equal to the optical phonon energy, (c) required emission wavelength. The doping levels are given by condition of balanced current injection described above.

The light emitting diode (LED) in accordance with the present invention is also characterized by what is presented in claim 12. The light emitting diode has a semiconductor heterostructure according to claim 5 or 10, which are explained earlier in this document. According to the present invention, said heterostructure is grown on a substrate whose material is GaP, GaAs or InP. In addition, the emitter layers are lattice matched to the substrate. In other words, the lattice constant of the emitter layer is substantially the same as that of the substrate.

As a summary, several advantages compared to the prior art are achieved with the present invention. In particular, the electron capture region with described phonon energy adjustment provides effective relaxation of the electron energy and suppresses electron overflow over the light generation layer. As a further advantage, concentrations of holes and electrons in the injection region can be matched to provide balance of injection currents in the light generation layer. As another further advantage, if the heterostructure is made of pyroelectric semiconductor materials, the light generation layer can have a composition, at which electrical field in this layer is approximately equal to zero. As a result, the total external quantum efficiency of a light emitting diode utilizing the heterostructure according to the present invention will be highly enhanced. The entire device is designed for enhanced light generating capability during high current density operation.

The foregoing description, as well as other advantages of the invention and the manner in which the same are accomplished, is further specified within the following detailed description and its accompanying drawings.

LIST OF FIGURES

In the following section, the invention will be described in detail with reference to the accompanying drawings, in which FIG. 1 is a schematic cross sectional view showing one example of the semiconductor heterostructure according to the present invention;

FIG. 5a illustrates a p-n junction based injection balanced semiconductor heterostructure in light emitting diodes according to the present invention, FIG. 5b illustrates the distribution of concentrations of electrons and holes across the same structure, and FIG. 5c illustrates the distribution of electron and hole current densities across the same structure; and FIG. 6 is a schematic cross sectional view showing semiconductor heterostructure in light emitting diodes made of nitrides of group III metals according to the present invention.

DETAILED DESCRIPTION OF THE INVENTION

Figure 1:
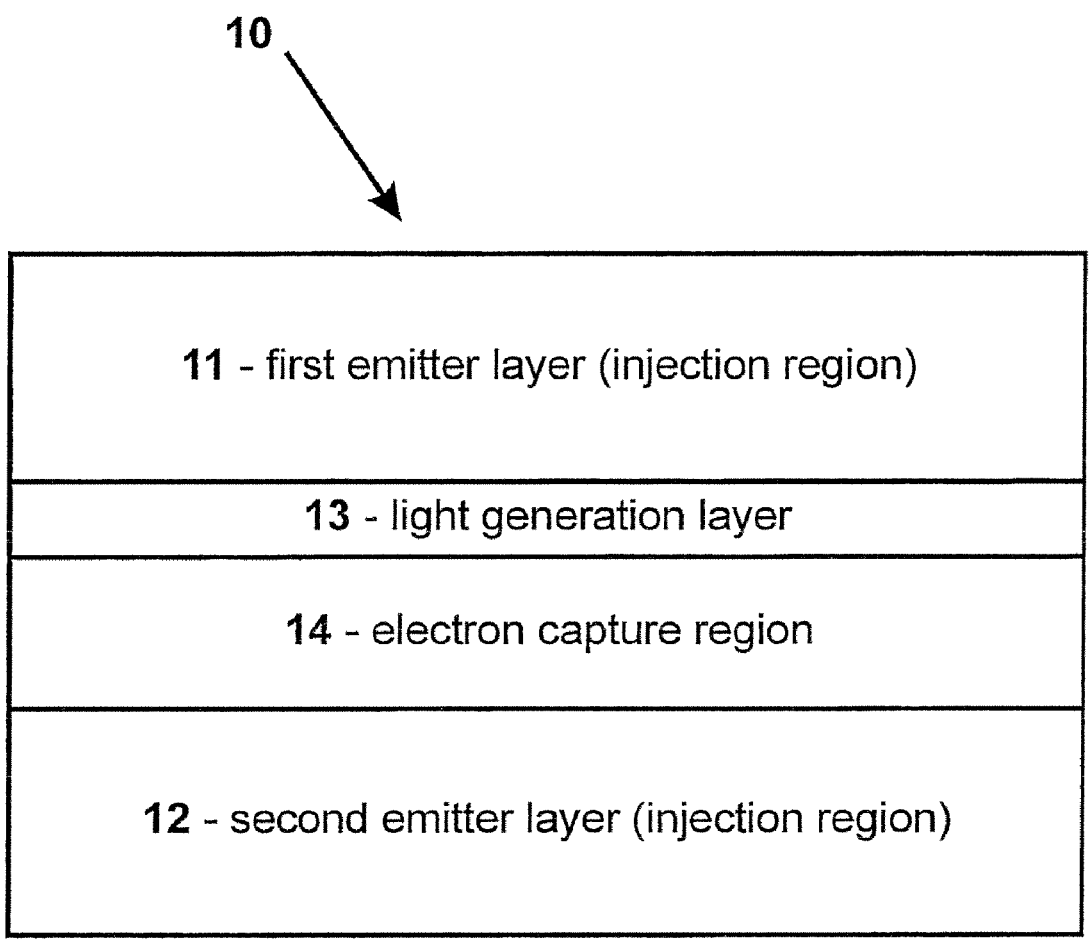

In FIG. 1 a cross-sectional schematic view of the semiconductor heterostructure is shown. The heterostructure, which is generally designated by 10, comprises an injection region consisting of a first emitter layer 11 and a second emitter layer 12, a light generation layer 13, and an electron capture region 14 consisting of a capture layer and a confining layer.

Figure 2:
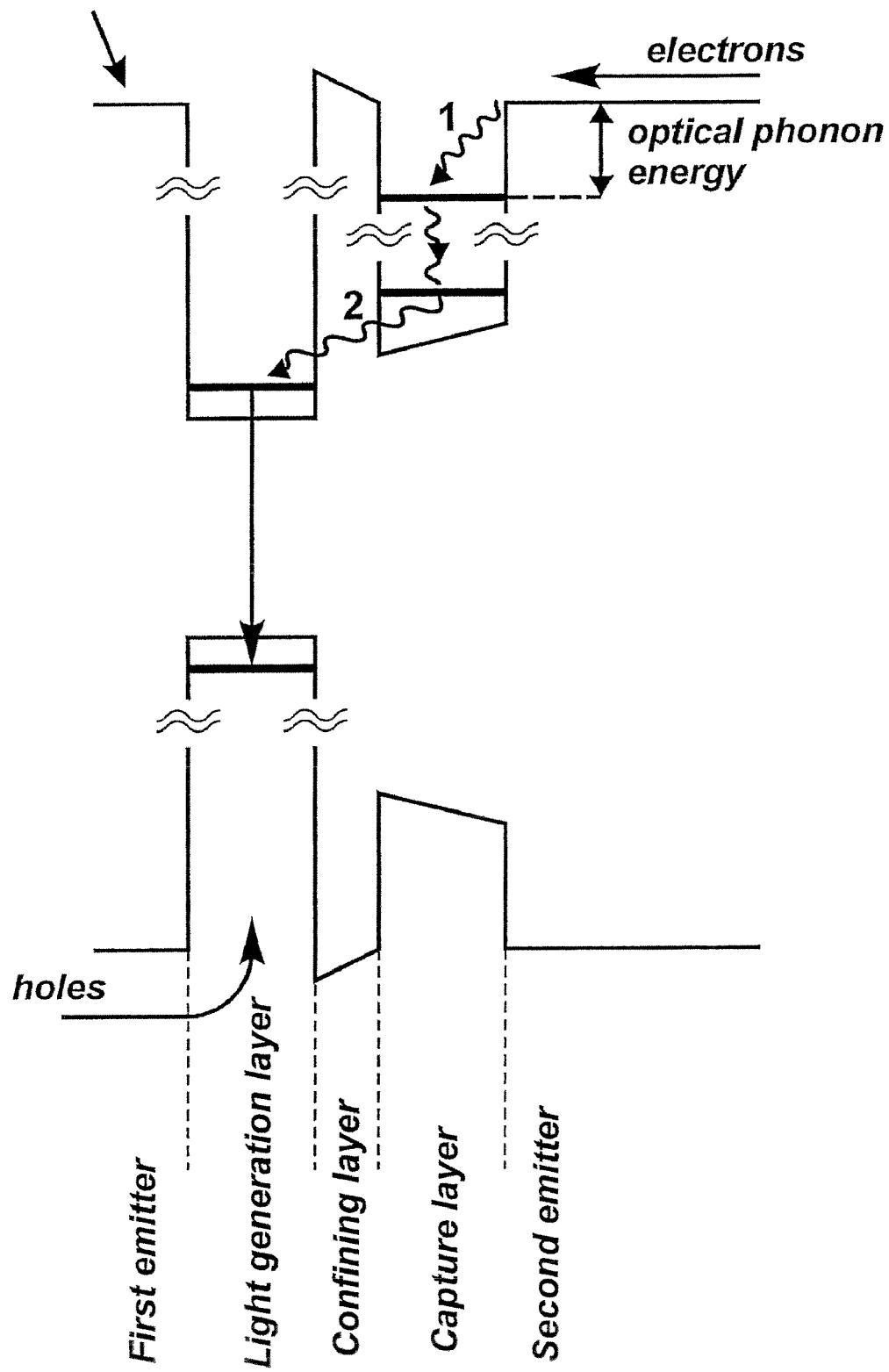
FIG. 2 illustrates the energy bands of the light generation layer and capture region of the semiconductor heterostructure of FIG. 1.

FIG. 2 represents a schematic energy band diagram of the heterostructure shown in FIG. 1. The capture region is a narrow bandgap layer adjacent to the second emitter layer. The layer with a wide bandgap between the capture and light generation layers is the confining layer. Widths and compositions of the capture and confining layers are adjusted to provide energy difference between one of the localized electron energy levels of the capture layer and the conduction band bottom in the electron emitter equal to the optical phonon energy. The capture of electrons into the narrow bandgap capture layer occurs due to interaction with longitudinal optical (LO) phonons, marked as 1. As a result, the capture efficiency will be enhanced in comparison with the capture to an arbitrary positioned level. Further relaxation of the carrier energy, marked as 2, occurs first via lower energy levels within the same narrow bandgap capture layer, and then to the adjacent narrow bandgap light generation layer.

Figure 3:
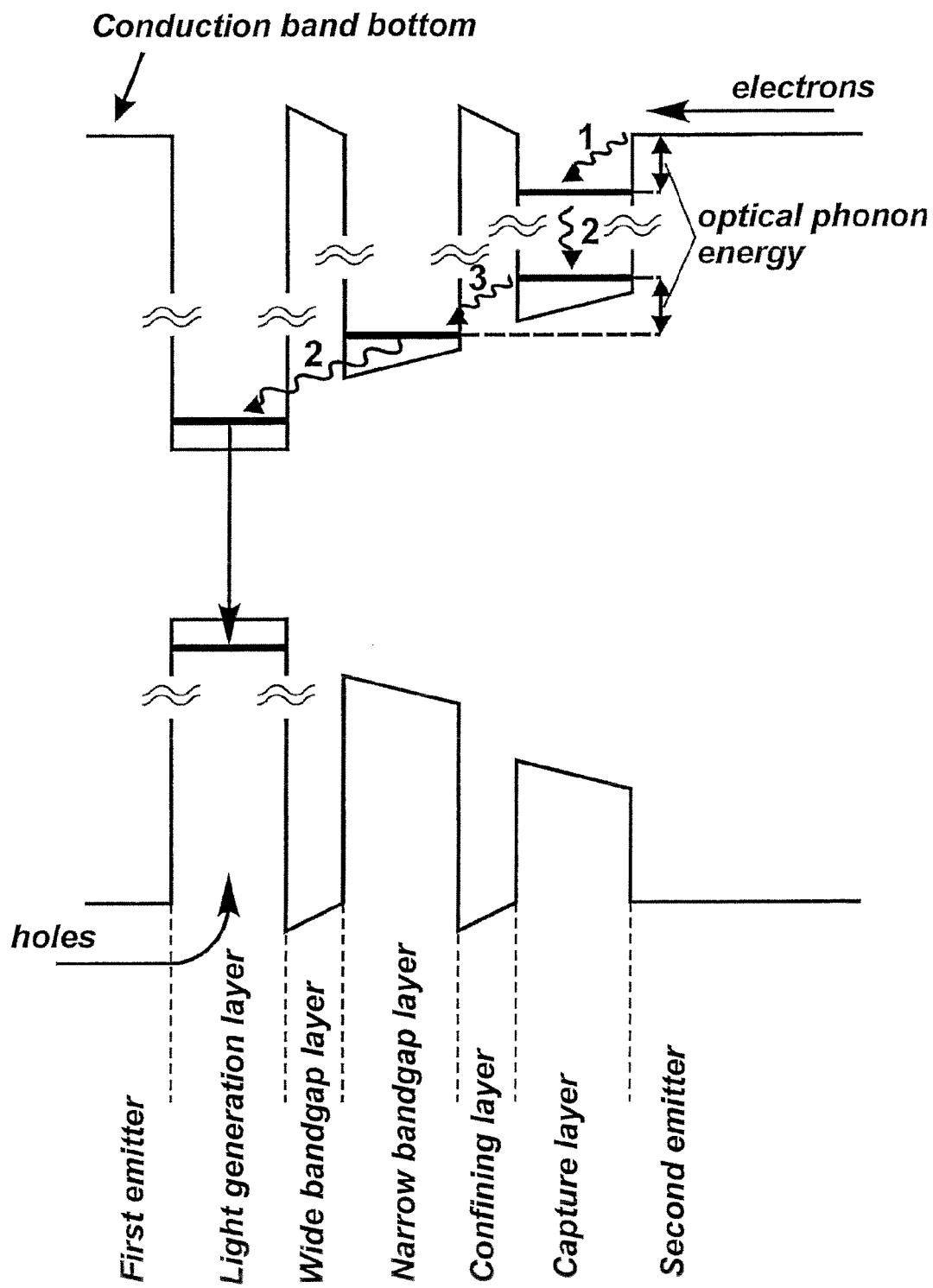
FIG. 3 illustrates the energy bands of a semiconductor heterostructure with a pair of wide and narrow bandgap layers inserted between the confining layer and the light generation layer according to the present invention.

FIG. 3 represents a schematic band diagram of the heterostructure with one pair of a wide and narrow bandgap layers added between the confining layer and the light generation layer. Compositions and widths of the inserted layers are adjusted to provide the lowest energy levels for electrons in the narrow bandgap layer higher than that in the light generation layer and lower than that of the capture layer. In addition the inserted layers are adjusted to provide energy difference between the lowest energy levels in the neighboring capture and narrow bandgap layers equal to the optical phonon energy. The capture of electrons into the narrow bandgap capture layer occurs as in the case of FIG. 2 due to interaction with longitudinal optical (LO) phonons, marked as 1. The downward energy relaxation in this structure occurs via sequence of processes marked as 2 and 3, the latter being a phonon assisted process. Due to the additional phonon assisted step 3, the energy relaxation will be further enhanced compared to the case without the additional layers.

Figure 4:
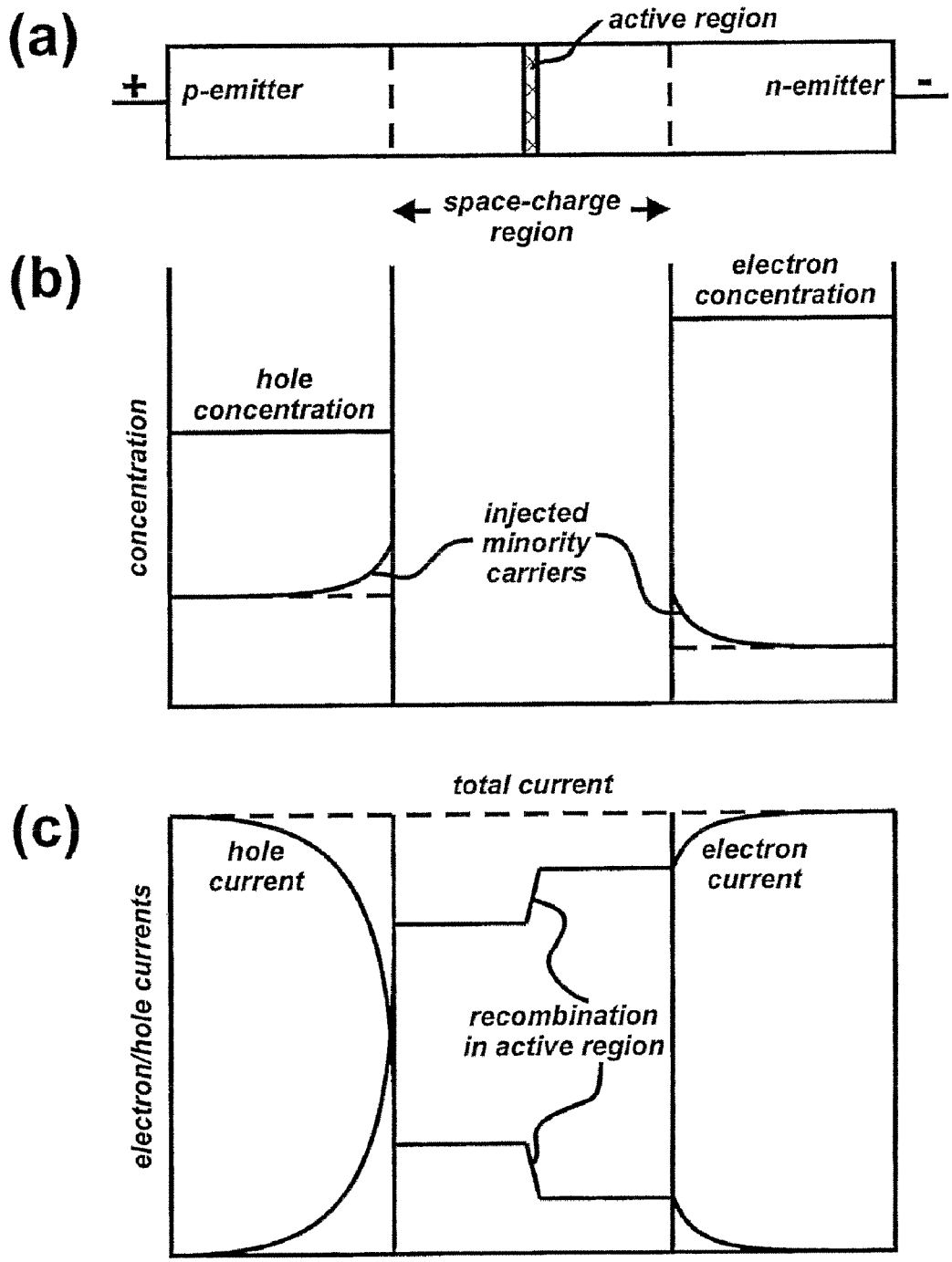
FIG. 4a illustrates a p-n junction based semiconductor heterostructure used in light emitting diodes in case electron concentration in n-emitter exceeds that of holes in p-emitter.
FIG. 4b illustrates the distribution of concentrations of electrons and holes across the same structure.
FIG. 4c illustrates the distribution of electron and hole current densities across the same structure.
Figure 5:
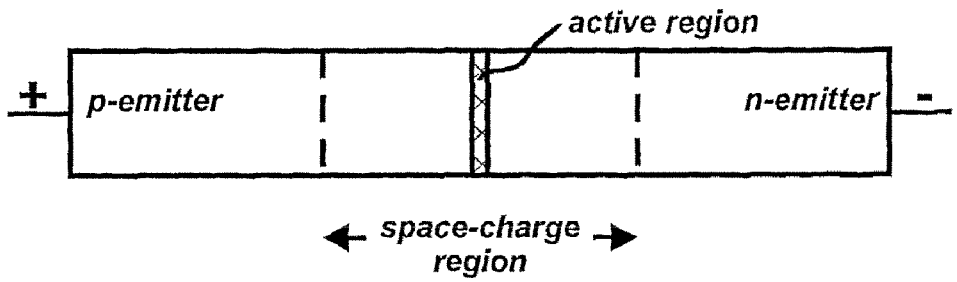
Figure 5:
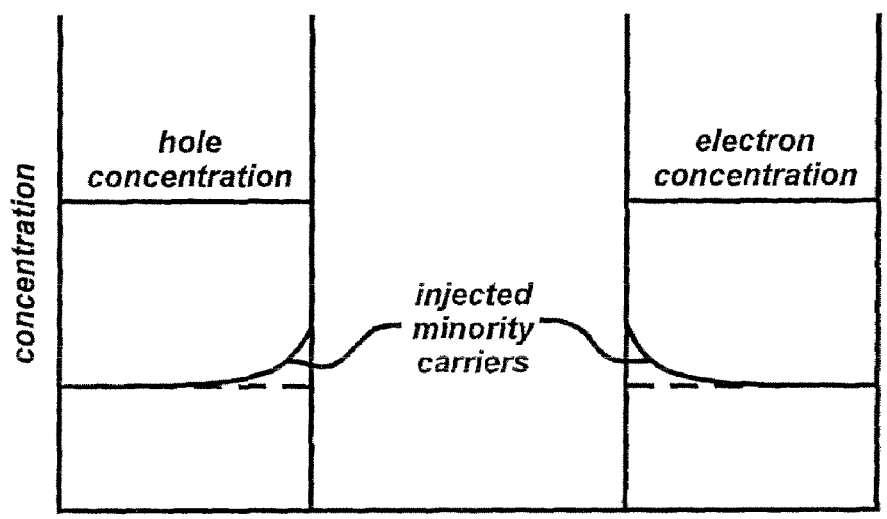
Figure 5:
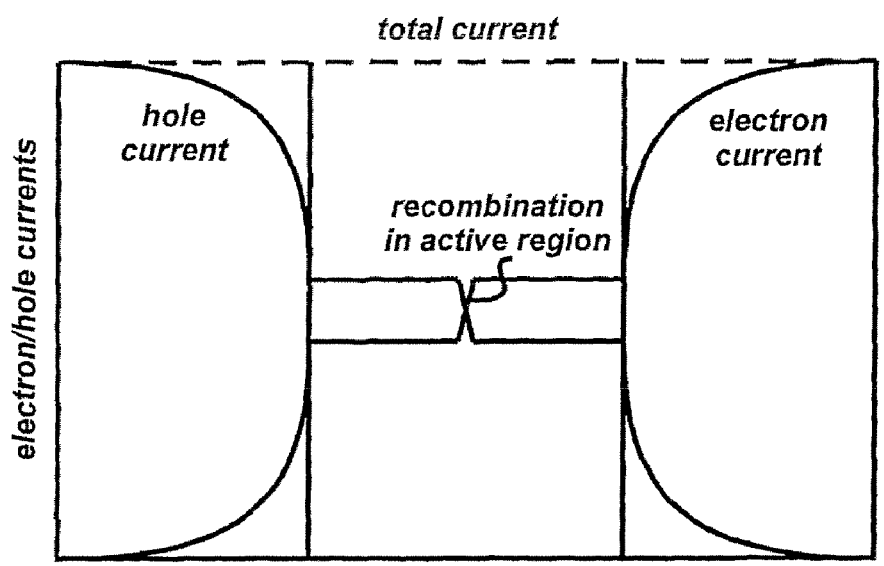

Comparison of FIG. 4 and FIG. 5 clarifies the effect of the electron concentration adjustment in accordance with the present invention. In the structure of FIG. 5 the electron concentration fulfils the condition $$n_n \approx \frac{D_p L_n}{D_n L_p} \cdot p_p,$$

where $D_p$ and $D_n$ are diffusion coefficients, $L_p$ and $L_n$ are diffusion lengths for minority carriers in n- and p-emitters, correspondingly. In this case the electron and hole current densities are equal at the p-n interface and thus the injection efficiency is maximal in contrast to the case of FIG. 4 with electron concentration in n-emitter exceeding that of holes in p-emitter.

FIG. 6 gives an example of the semiconductor heterostructure for light emitting diodes made of nitrides of group III metals according to the present invention. The heterostructure, which is generally designated by 10, comprises an injection region consisting of a first emitter layer 11 made of GaN having p-conductivity type with hole concentration of $5 \times 10^{17}$ cm$^{-3}$ and thickness of 0.5 µm, and a second emitter layer 12 made of GaN having n-conductivity type with electron concentration of $1 \times 10^{18}$ cm$^{-3}$ and thickness of 0.5 µm; a light generation layer 13 made of undoped $Al_{0.04}In_{0.22}Ga_{0.74}N$ having thickness of 0.003 µm; an electron capture region consisting of a confining layer 15 made of undoped $Al_{0.2}In_{0.05}Ga_{0.75}N$ having thickness of 0.0015 µm and an electron capture layer 16 made of undoped $In_{0.06}Ga_{0.94}N$ having thickness of 0.006 µm; and a low resistivity region 17 made of GaN and having n-conductivity type with electron concentration of $5 \times 10^{18}$ cm$^{-3}$ and thickness of 2 µm.

The invention is not limited merely to the examples referred to above; instead many variations are possible within the scope of the claims

The invention claimed is:

1. A strained semiconductor heterostructure (10) comprising:
    an injection region comprising a first emitter layer (11) having p-type conductivity and a second emitter layer (12) having n-type conductivity;
    a light generation layer (13) positioned between the first emitter layer (11) and the second emitter layer (12), the bandgap energy of said light generation layer being smaller than the ones of the first and the second emitter layers;
    an electron capture region (14) positioned between the light generation layer (13) and the second emitter layer (12), said electron capture region comprising a capture layer (16) adjacent to the second emitter layer, and a confining layer (15) adjacent to said electron capture layer, the bandgap energy of said confining layer being larger than that of the light generation layer, the bandgap energy of said capture layer being smaller than that of the confining layer, and the lowest energy level for electrons in the capture layer being higher than that in the light generation layer;
    characterized in that
    the widths and materials of the confining and capture layers (15, 16) are selected to provide energy difference between one of localized energy levels for electrons in the capture layer (16) and the conduction band bottom of the second emitter layer (12) equal to the energy of the optical phonon.

2. A strained semiconductor heterostructure (10) according to claim 1, characterized in that the concentration of electrons in the second emitter layer (12) is adjusted to equal to the product of:
    concentration of holes in the first emitter layer (11),
    the ratio of the diffusion coefficient for holes in the second emitter layer (12) and the diffusion coefficient for electrons in the first emitter layer (11), and
    the ratio of the diffusion length for electrons in the first emitter layer (11) and the diffusion length for holes in the second emitter layer (12).

3. A strained semiconductor heterostructure (10) according to claim 1, characterized in that said strained semiconductor heterostructure is formed of pyroelectric semiconductor materials; and
    the width and material of the light generation layer (13) are selected to provide a built-in electric field induced by spontaneous pyroelectric polarization having a magnitude substantially equal and direction substantially opposite to the corresponding ones of the built-in piezoelectric field.

4. A strained semiconductor heterostructure (10) according to claim 3, characterized in that at least one of the following conditions is fulfilled:
    said first emitter layer (11) comprises $Al_{x1}Ga_{1-x1}N$, in which $0 \leq x1 \leq 1$;
    said second emitter layer (12) comprises $Al_{x2}Ga_{1-x2}N$, in which $0 \leq x2 \leq 1$;
    said light generation layer (13) comprises $Al_{x3}In_{y3}Ga_{1-x3-y3}N$, in which $0 \leq x3 \leq 1$, $0 \leq y3 \leq 1$; 1, $0 \leq x3+y3 \leq 1$;
    said confining layer (15) comprises $Al_{x4}In_{y4}Ga_{1-x4-y4}N$, in which $0 \leq x4 \leq 1$, $0 \leq y4 \leq 1$, $0 \leq x4+y4 \leq 1$; and
    said capture layer (16) comprises $Al_{x5}In_{y5}Ga_{1-x5-y5}N$, in which $0 \leq x5 \leq 1$, $0 \leq y5 \leq 1$, $0 \leq x5+y5 \leq 1$.

5. A strained semiconductor heterostructure (10) according to claim 1, characterized in that at least one of the following conditions is fulfilled:
    said first emitter (11) layer comprises $Al_{x1}In_{y1}Ga_{1-x1-y1}As_{a1}N_{b1}P_{1-a1-b1}$, in which $0 \leq x1 \leq 1$, $0 \leq y1 \leq 1$, $0 \leq x1+y1 \leq 1$ and $0 \leq a1 \leq 1$, $0 < b1 \leq 0.1$, $0 \leq a1+b1 \leq 1$;
    said second emitter layer (12) comprises $Al_{x2}In_{y2}Ga_{1-x2-y2}As_{a2}N_{b2}P_{1-a2-b2}$ in which $0 \leq x2 \leq 1$, $0 \leq y2 \leq 1$, $0 \leq x2+y2 \leq 1$ and $0 \leq a2 \leq 1$, $0 < b2 \leq 0.1$, $0 \leq a2+b2 \leq 1$;
    said light generation layer (13) comprises $Al_{x3}In_{y3}Ga_{1-x3-y3}As_{a3}N_{b3}P_{1-a3-b3}$ in which $0 \leq x3 \leq 1$, $0 \leq y3 \leq 1$, $0 \leq x3+y3 \leq 1$ and $0 \leq a3 \leq 1$, $0 < b3 \leq 0.1$, $0 \leq a2+b2 \leq 1$;
    said confining layer (15) comprises $Al_{x4}In_{y4}Ga_{1-x4-y4}As_{a4}N_{b4}P_{1-a4-b4}$ in which $0 \leq x4 \leq 1$, $0 \leq y4 \leq 1$, $0 \leq x4+y4 \leq 1$ and $0 \leq a4 \leq 1$, $0 < b4 \leq 0.1$, $0 \leq a4+b4 \leq 1$; and
    said capture layer (16) comprises $Al_{x5}In_{y5}Ga_{1-x5-y5}As_{a5}N_{b5}P_{1-a5-b5}$ in which $0 \leq x5 \leq 1$, $0 \leq y5 \leq 1$, $0 \leq x5+y5 \leq 1$ and $0 \leq a5 \leq 1$, $0 < b5 \leq 0.1$, $0 \leq a5+b5 \leq 1$.

6. A strained semiconductor heterostructure (10) according to claim 1 characterized in that
    the capture region (16) comprises at least one pair of wide and narrow bandgap layers inserted between the confining layer (15) and the light generation layer (13), the layer adjacent to the confining layer being one of the narrow bandgap layers, the bandgap energies of the wide bandgap layers being larger than that of the light generation layer, the bandgap energies of the narrow bandgap layers being smaller than those of the wide bandgap layers, and the widths and materials of the wide and the narrow band-gap layers being selected to provide:
    the lowest energy level for electrons in any narrow bandgap layer higher than that in the light generation layer (13), lower than that of the capture layer (16), and lower than those in the narrow bandgap layers located between the considered narrow bandgap layer and the confining layer (15); and
    energy difference between the lowest localized energy levels for the electrons in the narrow bandgap layer adjacent to the confining layer and that in the capture layer (16) equal to the energy of the optical phonon.

7. A strained semiconductor heterostructure (10) according to claim 6, characterized in that said strained semiconductor heterostructure is formed of pyroelectric semiconductor materials; and
    the width and material of said light generation layer (13) are selected to provide a built-in electric field induced by spontaneous pyroelectric polarization having a magnitude substantially equal and direction substantially opposite to the corresponding ones of the built-in piezoelectric field.

8. A strained semiconductor heterostructure (10) according to claim 7, characterized in that at least one of the following conditions is fulfilled:
    said first emitter (11) layer comprises $Al_{x1}Ga_{1-x1}N$, in which $0 \leq x1 \leq 1$;
    said second emitter (12) layer comprises $Al_{x2}Ga_{1-x2}N$, in which $0 \leq x2 \leq 1$;
    said light generation layer (13) comprises $Al_{x3}In_{y3}Ga_{1-x3-y3}N$, in which $0 \leq x3 \leq 1$, $0 \leq y3 \leq 1$, $0 \leq x3+y3 \leq 1$;
    said confining layer (15) comprises $Al_{x4}In_{y4}Ga_{1-x4-y4}N$, in which $0 \leq x4 \leq 1$, $0 \leq y4 \leq 1$, $0 \leq x4+y4 \leq 1$;
    said electron capture layer (16) comprises $Al_{x5}In_{y5}Ga_{1-x5-y5}N$ in which $0 \leq x5 \leq 1$, $0 \leq y5 \leq 1$, $0 \leq x5+y5 \leq 1$; and
    said pairs of wide and narrow bandgap layers comprise alternating $Al_{mi}In_{ni}Ga_{1-mi-ni}N$ wide bandgap and $Al_{ki}$ $In_{li}Ga_{1-ki-li}N$ narrow bandgap layers, in which i numerates pairs, $0 \leq mi \leq 1$, $0 \leq ni \leq 1$, $0 \leq mi+ni \leq 1$, $0 \leq ki \leq 1$, $0 \leq li \leq 1$, $0 \leq ki+li \leq 1$.

9. A strained semiconductor heterostructure (10) according to claim 4, characterized in that
an additional low resistivity region (17) of n-type conductivity is added adjacent to said second emitter layer (12), the additional region comprising lateral current spreading superlattice formed of plurality of pairs of alternating and $Al_xGa_{1-x}N$ and $Al_yGa_{1-y}N$ layers, in which $0 \leq x \leq 1$ and $0 \leq y \leq 1$ and 0.

10. A strained semiconductor heterostructure (10) according to claim 6, characterized in that at least one of the following conditions is fulfilled:
said first emitter (11) layer comprises $Al_{x1}In_{y1}Ga_{1-x1-y1}As_{a1}N_{b1}P_{1-a1-b1}$, in which $0 \leq x1 \leq 1$, $0 \leq y1 \leq 1$, $0 \leq x1+y1 \leq 1$ and $0 \leq a1 \leq 1$, $0 < b1 \leq 0.1$, $0 \leq a1+b1 < 1$;
said second emitter layer (12) comprises $Al_{x2}In_{y2}Ga_{1-x2-y2}As_{a2}N_{b2}P_{1-a2-b2}$ in which $0 \leq x2 \leq 1$, $0 \leq y2 \leq 1$, $0 \leq x2+y2 \leq 1$ and $0 \leq a2 \leq 1$, $0 < b2 \leq 0.1$, $0 \leq a2+b2 \leq 1$;
said light generation layer (13) comprises $Al_{x3}In_{y3}Ga_{1-x3-y3}As_{a3}N_{b3}P_{1-a3-b3}$ in which $0 \leq x3 \leq 1$, $0 \leq y3 \leq 1$, $0 \leq x3+y3 \leq 1$ and $0 \leq a3 \leq 1$, $0 < b3 \leq 0.1$, $0 \leq a3+b3 \leq 1$;
said confining layer (15) comprises $Al_{x4}In_{y4}Ga_{1-x4-y4}As_{a4}N_{b4}P_{1-a4-b4}$ in which $0 \leq x4 \leq 1$, $0 \leq y4 \leq 1$, $0 \leq x4+y4 \leq 1$ and $0 \leq a4 \leq 1$, $0 < b4 \leq 0.1$, $0 \leq a4+b4 \leq 1$; and
said electron capture layer (16) comprises $Al_{x5}In_{y5}Ga_{1-x5-y5}As_{a5}N_{b5}P_{1-a5-b5}$ in which $0 \leq x5 \leq 1$, $0 \leq y5 \leq 1$, $0 \leq x5+y5 \leq 1$ and $0 \leq a5 \leq 1$, $0 < b5 \leq 0.1$, $0 \leq a5+b5 \leq 1$; and
said pairs of wide and narrow bandgap layers comprise alternating $Al_{mi}In_{ni}Ga_{1-mi-ni}As_{pi}N_{qi}P_{1-pi-qi}$ wide bandgap and $Al_{ki}In_{li}Ga_{1-ki-li}As_{ri}N_{si}P_{1-ri-si}$ narrow bandgap layers, in which i numerates pairs, $0 \leq mi \leq 1$, $0 \leq ni \leq 1$, $0 \leq mi+ni \leq 1$, and $0 \leq pi \leq 1$, $0 < qi \leq 0.1$, $0 \leq pi+qi \leq 1$, and $0 \leq ki \leq 1$, $0 \leq li \leq 1$, $0 \leq ki+li \leq 1$, and $0 \leq ri \leq 1$, $0 < si \leq 0.1$, $0 \leq ri+si \leq 1$.

11. A light emitting diode comprising a strained semiconductor heterostructure according to claim 1.

12. A light emitting diode comprising a strained semiconductor heterostructure according to claim 5, characterized in that
said strained semiconductor heterostructure is grown on a substrate whose material is selected from the group consisting of GaP, GaAs, InP; and
materials of said first and second emitter layers (11, 12) are selected to provide lattice match to said substrate.

13. A strained semiconductor heterostructure (10) comprising:
an injection region comprising a first emitter layer (11) having p-type conductivity and a second emitter layer (12) having n-type conductivity;
a light generation layer (13) positioned between the first emitter layer (11) and the second emitter layer (12), the bandgap energy of said light generation layer being smaller than the ones of the first and the second emitter layers;
an electron capture region (14) positioned between the light generation layer (13) and the second emitter layer (12), said electron capture region comprising a capture layer (16) adjacent to the second emitter layer, and a confining layer (15) adjacent to said electron capture layer, the bandgap energy of said confining layer being larger than that of the light generation layer, the bandgap energy of said capture layer being smaller than that of the confining layer, and the lowest energy level for electrons in the capture layer being higher than that in the light generation layer;

characterized in that the concentration of electrons in the second emitter layer (12) is adjusted to equal to the product of:
concentration of holes in the first emitter layer (11),
the ratio of the diffusion coefficient for holes in the second emitter layer (12) and the diffusion coefficient for electrons in the first emitter layer (11), and
the ratio of the diffusion length for electrons in the first emitter layer (11) and the diffusion length for holes in the second emitter layer (12).

14. A strained semiconductor heterostructure (10) according to claim 13, characterized in that said strained semiconductor heterostructure is formed of pyroelectric semiconductor materials; and
the width and material of the light generation layer (13) are selected to provide a built-in electric field induced by spontaneous pyroelectric polarization having a magnitude substantially equal and direction substantially opposite to the corresponding ones of the built-in piezoelectric field.

15. A strained semiconductor heterostructure (10) according to claim 14, characterized in that at least one of the following conditions is fulfilled:
said first emitter layer (11) comprises $Al_{x1}Ga_{1-x1}N$, in which $0 \leq x1 \leq 1$;
said second emitter layer (12) comprises $Al_{x2}Ga_{1-x2}N$, in which $0 \leq x2 \leq 1$;
said light generation layer (13) comprises $Al_{x3}In_{y3}Ga_{1-x3-y3}N$, in which $0 \leq x3 \leq 1$, $0 \leq y3 \leq 1$, $0 \leq x3+y3 \leq 1$;
said confining layer (15) comprises $Al_{x4}In_{y4}Ga_{1-x4-y4}N$, in which $0 \leq x4 \leq 1$, $0 \leq y4 \leq 1$, $0 \leq x4+y4 \leq 1$; and
said capture layer (16) comprises $Al_{x5}In_{y5}Ga_{1-x5-y5}N$, in which $0 \leq x5 \leq 1$, $0 \leq y5 \leq 1$, $0 \leq x5+y5 \leq 1$.

16. A strained semiconductor heterostructure (10) according to claim 13, characterized in that at least one of the following conditions is fulfilled:
said first emitter (11) layer comprises $Al_{x1}In_{y1}Ga_{1-x1-y1}As_{a1}N_{b1}P_{1-a1-b1}$, in which $0 \leq x1 \leq 1$, $0 \leq y1 \leq 1$, $0 \leq x1+y1 \leq 1$ and $0 \leq a1 \leq 1$, $0 < b1 \leq 0.1$, $0 \leq a1+b1 \leq 1$;
said second emitter layer (12) comprises $Al_{x2}In_{y2}Ga_{1-x2-y2}As_{a2}N_{b2}P_{1-a2-b2}$, in which $0 \leq x2 \leq 1$, $0 \leq y2 \leq 1$, $0 \leq x2+y2 \leq 1$ and $0 \leq a2 \leq 1$, $0 < b2 \leq 0.1$, $0 \leq a2+b2 \leq 1$;
said light generation layer (13) comprises $Al_{x3}In_{y3}Ga_{1-x3-y3}As_{a3}N_{b3}P_{1-a3-b3}$, in which $0 \leq x3 \leq 1$, $0 \leq y3 \leq 1$, $0 \leq x3+y3 \leq 1$ and $0 \leq a3 \leq 1$, $0 < b3 \leq 0.1$, $0 \leq a3+b3 \leq 1$;
said confining layer (15) comprises $Al_{x4}In_{y4}Ga_{1-x4-y4}As_{a4}N_{b4}P_{1-a4-b4}$, in which $0 \leq x4 \leq 1$, $0 \leq y4 \leq 1$, $0 \leq x4+y4 \leq 1$ and $0 \leq a4 \leq 1$, $0 < b4 \leq 0.1$, $0 \leq a4+b4 \leq 1$; and
said capture layer (16) comprises $Al_{x5}In_{y5}Ga_{1-x5-y5}As_{a5}N_{b5}P_{1-a5-b5}$, in which $0 \leq x5 \leq 1$, $0 \leq y5 \leq 1$, $0 \leq x5+y5 \leq 1$ and $0 \leq a5 \leq 1$, $0 < b5 \leq 0.1$, $0 \leq a5+b5 \leq 1$.

17. A strained semiconductor heterostructure (10) according to claim 13, characterized in that the capture region (16) comprises at least one pair of wide and narrow bandgap layers inserted between the confining layer (15) and the light generation layer (13), the layer adjacent to the confining layer being one of the narrow bandgap layers, the bandgap energies of the wide bandgap layers being larger than that of the light generation layer, the bandgap energies of the narrow bandgap layers being smaller than those of the wide bandgap layers, and the widths and materials of the wide and the narrow bandgap layers being selected to provide the lowest energy level for electrons in any narrow bandgap layer higher than that in the light generation layer (13), lower than that of the capture layer (16), and lower than those in the narrow bandgap layers located between the considered narrow bandgap layer and the confining layer (15).

18. A strained semiconductor heterostructure (10) according to claim 17, characterized in that the widths and materials of the wide and the narrow bandgap layers are selected to provide energy difference between the lowest localized energy levels for the electrons in the narrow bandgap layer adjacent to the confining layer and that in the capture layer (16) equal to the energy of the optical phonon.

19. A strained semiconductor heterostructure (10) according to claim 17, characterized in that said strained semiconductor heterostructure is formed of pyroelectric semiconductor materials; and the width and material of said light generation layer (13) are selected to provide a built-in electric field induced by spontaneous pyroelectric polarization having a magnitude substantially equal and direction substantially opposite to the corresponding ones of the built-in piezoelectric field.

20. A strained semiconductor heterostructure (10) according to claim 19, characterized in that at least one of the following conditions is fulfilled:

said first emitter layer (11) comprises $Al_{x1}Ga_{1-x1}N$, in which $0 \leq x1 \leq 1$;

said second emitter layer (12) comprises $Al_{x2}Ga_{1-x2}N$, in which $0 \leq x2 \leq 1$;

said light generation layer (13) comprises $Al_{x3}In_{y3}Ga_{1-x3-y3}N$, in which $0 \leq x3 \leq 1$, $0 \leq y3 \leq 1$, $0 \leq x3+y3 \leq 1$;

said confining layer (15) comprises $Al_{x4}In_{y4}Ga_{1-x4-y4}N$, in which $0 \leq x4 \leq 1$, $0 \leq y4 \leq 1$, $0 \leq x4+y4 \leq 1$;

said electron capture layer (16) comprises $Al_{x5}In_{y5}Ga_{1-x5-y5}N$, in which $0 \leq x5 \leq 1$, $0 \leq y5 \leq 1$, $0 \leq x5+y5 \leq 1$; and said pairs of wide and narrow bandgap layers comprise alternating $Al_{mi}In_{ni}Ga_{1-mi-ni}N$ wide bandgap and $Al_{ki}In_{li}Ga_{1-ki-li}N$ narrow bandgap layers, in which i numerates pairs, $0 \leq mi \leq 1$, $0 \leq ni \leq 1$, $0 \leq mi+ni \leq 1$, $0 \leq ki \leq 1$, $0 \leq li \leq 1$, $0 \leq ki+li \leq 1$.

21. A strained semiconductor heterostructure (10) according to claim 15, characterized in that an additional low resistivity region (17) of n-type conductivity is added adjacent to said second emitter layer (12), the additional region comprising lateral current spreading superlattice formed of plurality of pairs of alternating $Al_xGa_{1-x}N$ and $Al_yGa_{1-y}N$ layers, in which $0 \leq x \leq 1$ and $0 \leq y \leq 1$.

22. A strained semiconductor heterostructure (10) according to claim 17, characterized in that at least one of the following conditions is fulfilled:

said first emitter layer (11) comprises $Al_{x1}In_{y1}Ga_{1-x1-y1}As_{a1}N_{b1}P_{1-a1-b1}$, in which $0 \leq x1 \leq 1$, $0 \leq y1 \leq 1$, $0 \leq x1+y1 \leq 1$ and $0 \leq a1 \leq 1$, $0 < b1 \leq 0.1$, $0 \leq a1+b1 \leq 1$;

said second emitter layer (12) comprises $Al_{x2}In_{y2}Ga_{1-x2-y2}As_{a2}N_{b2}P_{1-a2-b2}$, in which $0 \leq x2 \leq 1$, $0 \leq y2 \leq 1$, $0 \leq x2+y2 \leq 1$ and $0 \leq a2 \leq 1$, $0 < b2 \leq 0.1$, $0 \leq a2+b2 \leq 1$;

said light generation layer (13) comprises $Al_{x3}In_{y3}Ga_{1-x3-y3}As_{a3}N_{b3}P_{1-a3-b3}$, in which $0 \leq x3 \leq 1$, $0 \leq y3 \leq 1$, $0 \leq x3+y3 \leq 1$ and $0 \leq a3 \leq 1$, $0 < b3 \leq 0.1$, $0 \leq a3+b3 \leq 1$;

said confining layer (15) comprises $Al_{x4}In_{y4}Ga_{1-x4-y4}As_{a4}N_{b4}P_{1-a4-b4}P_{1-a4-b4}$, in which $0 \leq x4 \leq 1$, $0 \leq y4 \leq 1$, $0 \leq x4+y4 \leq 1$ and $0 \leq a4 \leq 1$, $0 < b4 \leq 0.1$, $0 \leq a4+b4 \leq 1$;

said electron capture layer (16) comprises $Al_{x5}In_{y5}Ga_{1-x5-y5}As_{a5}N_{b5}P_{1-a5-b5}$, in which $0 \leq x5 \leq 1$, $0 \leq y5 \leq 1$, $0 \leq x5+y5 \leq 1$ and $0 \leq a5 \leq 1$, $0 < b5 \leq 0.1$, $0 \leq a5+b5 \leq 1$; and said pairs of wide and narrow bandgap layers comprise alternating $Al_{mi}In_{ni}Ga_{1-mi-ni}As_{pi}N_{qi}P_{1-pi-qi}$ wide bandgap and $Al_{ki}In_{li}Ga_{1-ki-li}As_{ri}N_{si}P_{1-ri-si}$ narrow bandgap layers, in which i numerates pairs, $0 \leq mi \leq 1$, $0 \leq ni \leq 1$, $0 \leq mi+ni \leq 1$, and $0 \leq pi \leq 1$, $0 < qi \leq 0.1$, $0 \leq pi+qi \leq 1$, and $0 \leq ki \leq 1$, $0 \leq li \leq 1$, $0 \leq ki+li \leq 1$, and $0 \leq ri \leq 1$, $0 < si \leq 0.1$, $0 \leq ri+si \leq 1$.

23. A light emitting diode comprising a strained semiconductor heterostructure according to claim 13.

24. A light emitting diode comprising a strained semiconductor heterostructure according to claim 16, characterized in that said strained semiconductor heterostructure is grown on a substrate whose material is selected from the group consisting of GaP, GaAs, InP; and materials of said first and second emitter layers (11, 12) are selected to provide lattice match to said substrate.

* * * * *